(12) United States Patent
Nishi et al.

(10) Patent No.: US 7,335,951 B2
(45) Date of Patent: Feb. 26, 2008

(54) SEMICONDUCTOR DEVICE AND METHOD FOR MANUFACTURING THE SAME

(75) Inventors: Kazuo Nishi, Yamanashi (JP); Hiroki Adachi, Yamanashi (JP); Junya Maruyama, Kanagawa (JP); Naoto Kusumoto, Kanagawa (JP); Yuusuke Sugawara, Yamanashi (JP); Tomoyuki Aoki, Kanagawa (JP); Eiji Sugiyama, Kanagawa (JP); Hironobu Takahashi, Yamanashi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 33 days.

(21) Appl. No.: 10/957,747

(22) Filed: Oct. 5, 2004

(65) Prior Publication Data

US 2005/0116310 A1 Jun. 2, 2005

(30) Foreign Application Priority Data

Oct. 6, 2003 (JP) ............................ 2003-347676

(51) Int. Cl.
*H01L 27/01* (2006.01)
(52) U.S. Cl. ..................................... 257/350; 257/690
(58) Field of Classification Search ................ 257/690, 257/730, 347, 350, 59, 72
See application file for complete search history.

(56) References Cited

U.S. PATENT DOCUMENTS

| | | | |
|---|---|---|---|
| 5,501,989 A | 3/1996 | Takayama et al. | |
| 5,589,694 A | 12/1996 | Takayama et al. | |
| 5,744,822 A | 4/1998 | Takayama et al. | |
| 5,821,597 A * | 10/1998 | Nakajima et al. | 257/458 |
| 6,383,835 B1 | 5/2002 | Hata et al. | |
| 6,459,132 B1 * | 10/2002 | Mochizuki | 257/443 |
| 6,720,576 B1 | 4/2004 | Nakajima et al. | |
| 6,747,290 B2 | 6/2004 | Yamazaki et al. | |
| 6,777,746 B2 * | 8/2004 | Kitagawa et al. | 257/335 |
| 7,030,551 B2 | 4/2006 | Yamazaki et al. | |
| 7,042,052 B2 * | 5/2006 | Bhattacharyya | 257/347 |
| 7,042,099 B2 * | 5/2006 | Kurashima et al. | 257/774 |
| 7,068,246 B2 | 6/2006 | Yamazaki et al. | |
| 2002/0053742 A1 | 5/2002 | Hata et al. | |
| 2004/0042707 A1 | 3/2004 | Imai et al. | |

FOREIGN PATENT DOCUMENTS

| | | |
|---|---|---|
| EP | 0 790 653 | 8/1997 |
| JP | 06-275808 | 9/1994 |
| JP | 08-078329 | 3/1996 |
| JP | 09-129780 | 5/1997 |
| JP | 2003-060744 | 2/2003 |

* cited by examiner

*Primary Examiner*—Mark V. Prenty
(74) *Attorney, Agent, or Firm*—Eric J. Robinson; Robinson Intellectual Property Law Office, P.C.

(57) ABSTRACT

The present invention provides a semiconductor device formed over an insulating substrate, typically a semiconductor device having a structure in which mounting strength to a wiring board can be increased in an optical sensor, a solar battery, or a circuit using a TFT, and which can make it mount on a wiring board with high density, and further a method for manufacturing the same. According to the present invention, in a semiconductor device, a semiconductor element is formed on an insulating substrate, a concave portion is formed on a side face of the semiconductor device, and a conductive film electrically connected to the semiconductor element is formed in the concave portion.

119 Claims, 11 Drawing Sheets

LASER LIGHT IRRADIATION

LASER LIGHT IRRADIATION

609

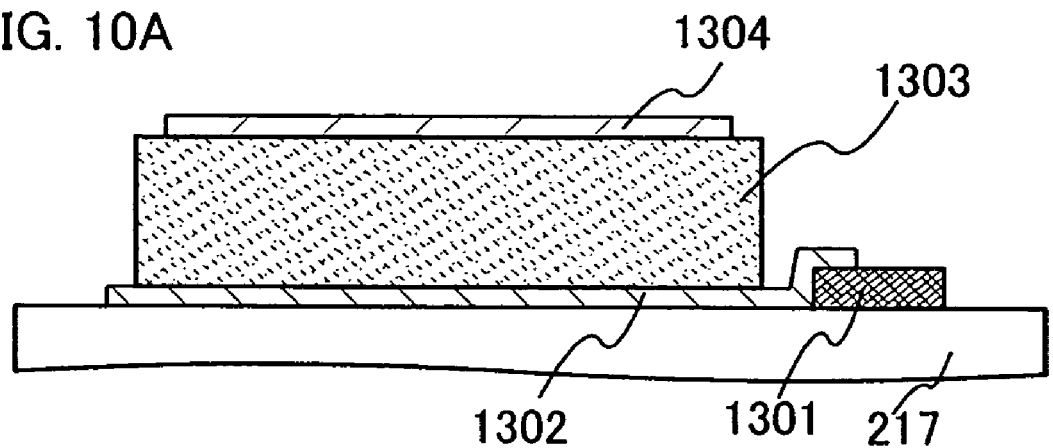
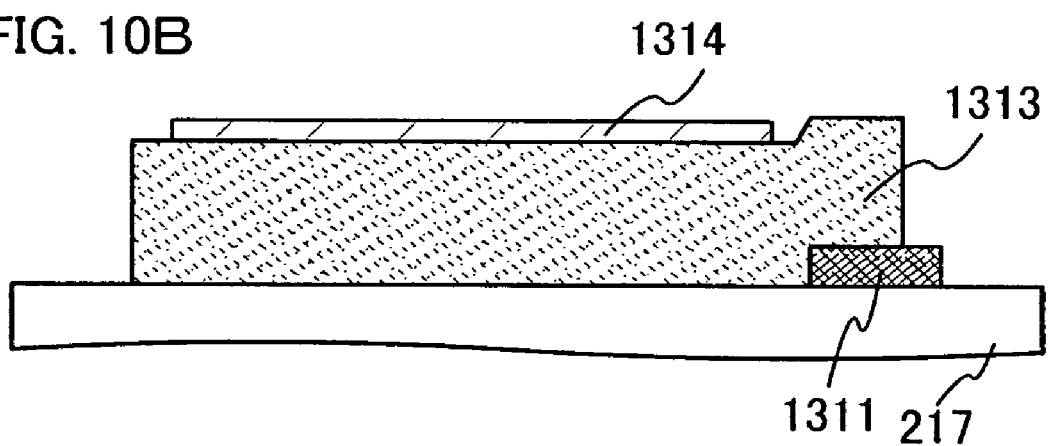
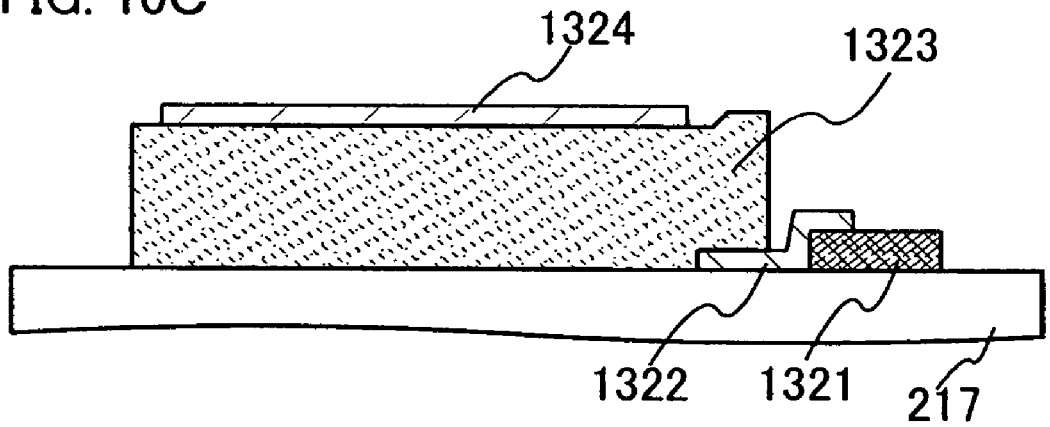

SEMICONDUCTOR DEVICE AND METHOD FOR MANUFACTURING THE SAME

BACKGROUND OF THE INVENTION

1. Field of the Invention

The present invention relates to a semiconductor device that is thin and lightweight, and a method for manufacturing the same.

2. Description of the Related Art

In recent yeas, cellular phones spread with progress of communication technology. Furthermore, more moving images and more information are greatly expected to be sent in the future. On the other hand, personal computers for mobile are produced by virtue of the weight saving. A large number of portable information terminal such as PDA (personal digital assistants), which begin from an electronic notebook, are produced, and are being widely used. Moreover, most of such portable information devices are each equipped with a flat panel display with the development in display devices.

In such a display device, brightness in the periphery of the display device is detected, and its display brightness is adjusted. Thus, needless electric power consumption can be eliminated by detecting brightness in the periphery and obtaining moderate display brightness. For example, such an optical sensor device for brightness control is used for cellular phones and personal computers (for example, Reference 1: Japanese Patent Laid Open No. 2003-60744).

As a material of an optical sensor, a semiconductor is mainly used, and silicon is given as a representative example of the semiconductor material. As optical sensors using silicon, there are an optical sensor using single crystal silicon or polysilicon and an optical sensor using amorphous silicon. As for the optical sensor using single crystal silicon or polysilicon, sensitivity is highest in the infrared region of approximately 800 nm, and has sensitivity even at approximately 1100 nm. Therefore, in the case of sensing white fluorescent light that hardly include a spectrum of the infrared region and sunlight having a wide spectrum from the ultraviolet region to the infrared region, there is a problem that sensing results of each light are different while actual illuminance thereof are equal.

Further, the optical sensor using single crystal silicon is used as a resin sealing package using a lead frame for mounting on a wiring board or the like, or a package in which a single crystal silicon is mounted on a resin substrate provided with a circuit pattern by a wire bonding method or a face down method.

On the other hand, the optical sensor using amorphous silicon hardly has sensitivity against light in the infrared region, and has the highest sensitivity in a range of about 500 nm to 600 nm that is a center of wavelength of the visible light region. That is, the optical sensor using amorphous silicon has sensing characteristics that are similar to human visibility. Therefore, the optical sensor using amorphous silicon is preferable.

On the other hand, a light-transmitting plastic substrate is preferably used instead of a glass substrate. This is because a plastic substrate is thinner and lighter than a glass substrate, and a wiring board mounting them and electronic devices using it can be also thinner and smaller. Further, this is because a plastic substrate is flexible and can be set on a curved surface. Moreover, an element that can resist an impact can be provided by using a plastic substrate having flexibility.

However, since a plastic substrate is thin, a connection terminal cannot be formed on a side face of a substrate. Therefore, a connection terminal is formed on one surface of the substrate so as to a wiring board. A wiring board and an optical sensor are fixed by only one surface with a solder, and its area for bonding is small. Thus, there is a problem that mounting strength is weak as compared with a side electrode structure since the bonding area is small.

In addition, it is difficult to see a connection portion of an electrode of the optical sensor and an electrode terminal and to judge whether these connects to each other surely, because a region where the wiring board is connected to the optical sensor is in the lower part of a substrate of the optical sensor.

In addition, since some conventional organic resin materials or plastic substrates have poor heat-resistance, they cannot be mounted on a wiring board by a reflow step using solders.

Further, the optical sensor using single crystal silicon has a packaging structure, in which a wiring region for mounting an optical sensor (for example, regions provided with a lead frame and a circuit pattern) is larger than an area for functioning as an optical sensor. Accordingly, such a packaging structure of an optical sensor is interfering with high integration on a wiring board.

SUMMARY OF THE INVENTION

In view of the above described problems, it is an object of the present invention to provide a semiconductor device formed over an insulating substrate, typically an optical sensor, a solar battery, or a circuit using a TFT, a semiconductor device having a structure in which mounting strength to a wiring board can be increased and which can make it mount on a wiring board with high density, and further provide a method for manufacturing the same.

One feature of the present invention is a semiconductor device in which a semiconductor element is formed on an insulating substrate, a concave portion is formed on a side face of the semiconductor device, and a conductive film electrically connected to the semiconductor element is formed in the concave portion.

Another feature of the present invention is a semiconductor device having a semiconductor element formed on an insulating substrate, an electrode terminal to be connected with the semiconductor element, and a connection terminal to be connected to the electrode terminal, wherein a concave portion is formed in side faces of the insulating substrate and the semiconductor element, and the connection terminal covers the insulating substrate and the semiconductor element in the concave portion.

Another feature of the present invention is a semiconductor device having a concave portion in a side face thereof, which comprises a semiconductor element formed over an insulating substrate, an insulating film covering the semiconductor element, and a conductive film to be electrically connected to the semiconductor element, wherein the conductive film is formed in the concave portion and covers the side faces of the insulating substrate and insulating film.

One feature of the present invention is a semiconductor device having a concave portion in a side face thereof, includes a semiconductor element formed on an insulating substrate, an electrode terminal to be connected to the semiconductor element, an insulating film covering the semiconductor element and the electrode terminal, and a connection terminal to be connected to the electrode terminal through the insulating film, wherein the connection terminal is in contact with side faces of the insulating substrate, the semiconductor element, and the insulating film in the concave portion.

The area of the insulating substrate and the area for forming the semiconductor element are almost equal according to the present invention.

A substrate that has heat resistance enough to resist in a mounting step on a board for mounting is preferably used for the insulating substrate. A substrate having a glass transition temperature of 260° C. or more is further preferable. A light-transmitting substrate is also preferable. As a typical example, a plastic substrate, a glass substrate, and a substrate made of organic resin are cited.

The above-mentioned conductive film is a connection terminal. The connection terminal is a terminal for electrically connecting a substrate to mount a semiconductor device, e.g., an electrode terminal formed on a wiring board, and a semiconductor element of the semiconductor device. The connection terminal is electrically connected to the electrode terminal on the wiring board by a conductive paste, an anisotropic conductive adhesive agent, an anisotropic conductive film or the like and they are fixed.

The above-mentioned concave portion is semicylinder like or rectangular column like, and has a curved surface or a flat surface. Further, the concave portion may be a shape having a curved surface and a flat surface.

The semiconductor element is an element in which an active region is made of a semiconductor thin film, and is typified by a diode, a TFT, a capacitor element and the like. In addition, the semiconductor thin film is formed from an inorganic material or an organic material.

For a representative example of a semiconductor film formed from an inorganic material, a silicon film, a gallium film, a silicon film added with gallium, a silicon carbide film and the like can be given. In addition, a representative example of a semiconductor film formed from an organic material includes polymer or oligomer represented by conjugated polymer, for example, a polyphenylenevinylene derivative, a polyfluorene derivative, a polythiophene derivative, a polyphenylene derivative and a copolymer thereof such as oligophenylene, and oligothiophene. Further, pentacene, tetracene, copper phthalocyanine, perfluorinated phthalocyanine, a perylene derivative and the like are given for an example of a low molecular substance.

In the present invention, when the semiconductor device is an optical sensor, a photoelectric conversion device, a solar battery, a semiconductor film is formed from a film comprising silicon. For a representative example of the semiconductor film having silicon, a silicon film, a silicon germanium film, a silicon carbide film and a PN junction film or a PIN junction film thereof are given. It is desirable that I layers of the PIN junction film are formed from an amorphous silicon layer.

In addition, an amplifier circuit or an amplifier element may be provided in the light-receiving portion for amplifying a detection amount of light received in a light-receiving portion. A current mirror circuit formed from a TFT is given for a representative example of the amplifier circuit, and an operation amplifier (op-amp) is given for a representative example of the amplifier element.

Moreover, as the semiconductor device of the present invention, an integrated circuit which is formed by using an optical sensor, a photoelectric conversion device, or a solar battery, and which includes a TFT, a capacitor element or the like, is given. In addition, a functional circuit such as a memory or a CPU is cited as the integrated circuit using a TFT.

Also, the present invention relates to a method for manufacturing a semiconductor device, wherein a plurality of semiconductor elements are formed over the insulating substrate, an opening portion is formed at a desired portion of the substrate, a conductive film electrically connected to the semiconductor element is formed in the opening portion, and then, the semiconductor elements are cut out to form chip-like semiconductor devices.

As the method for forming the opening portion, a laser irradiation method, an etching method, a method of pressing with a mold and the like are given.

The semiconductor device of the present invention has a concave portion in a side face of an insulating substrate, and a connection terminal can be formed in the portion. In other words, a semiconductor device having a side electrode can be formed. Thus, an area for connection with a wiring board can be increased, the mounting strength is also increased, and at the same time, the condition of connection can be seen and confirmed visibly. Accordingly, reliability on process can be enhanced. Also, since a connection terminal can be formed by forming an opening portion in the substrate and forming a conductive film along the opening portion, connection terminals for a plurality of semiconductor device can be provided on one substrate. Therefore, it is possible to form a plurality of semiconductors device by using one substrate, to increase throughput in the step of forming a connection terminal, and to mass-produce. Moreover, a semiconductor element is formed over a substrate, and the area of the substrate and the area of an effective region needed for functioning as the semiconductor element are almost equal. Thus, a large number of semiconductor elements can be integrated highly on a wiring board or the like. These and other objects, features and advantages of the present invention become more apparent upon reading of the following detailed description along with the accompanying drawings.

DETAILED DESCRIPTION OF THE INVENTION

Hereinafter, embodiment modes of the present invention are described with reference to the accompanying drawings. The present invention can be implemented in various different modes. It will be obvious to those skilled in the art that various changes may be made without departing from the scope of the present invention. Therefore, the present invention should not be limited to the embodiment modes. Hereinafter, an optical sensor is described as a representative example of semiconductor devices, but the present invention is not limited thereto, and can be applied to an integrated circuit formed by using a photoelectric conversion device, a solar battery, a TFT, and/or the like. A plastic substrate is used as an insulating substrate, but the present invention is not limited thereto. A glass substrate, a substrate made of organic resin or the like can be employed.

Embodiment Mode 1

An optical sensor that is formed over a plastic substrate and that has a concave portion in a side face thereof is described with reference to FIGS. 1A and 1B in this embodiment mode.

Figure 1A:
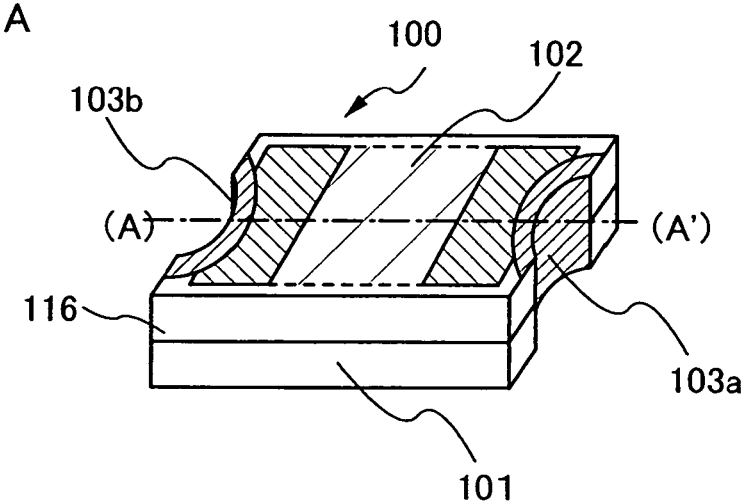
FIGS. 1A and 1B each show an oblique drawing and a cross sectional view of a semiconductor device of the present invention.

FIG. 1A is an oblique drawing of an optical sensor 100 of the present invention. A semiconductor element 102 is formed over a plastic substrate 101. A side face of the optical sensor 100 has a concave shape, and a conductive film to be connection terminals 103a and 103b is formed in this area.

The semiconductor element 102 can be integrally formed on the substrate by using a semiconductor film, preferably, a semiconductor thin film, and thus, downsizing and thinning of a semiconductor device can be achieved.

The concave shape in the side face of the optical sensor is curved in this embodiment mode. Note that the concave shape may have a flat surface. That is to say, the concave shape is a semi cylindrical having a curved surface or a rectangular column having a flat surface.

Further, the concave portion may have a shape having both a curved surface and a flat surface.

Figure 1B:
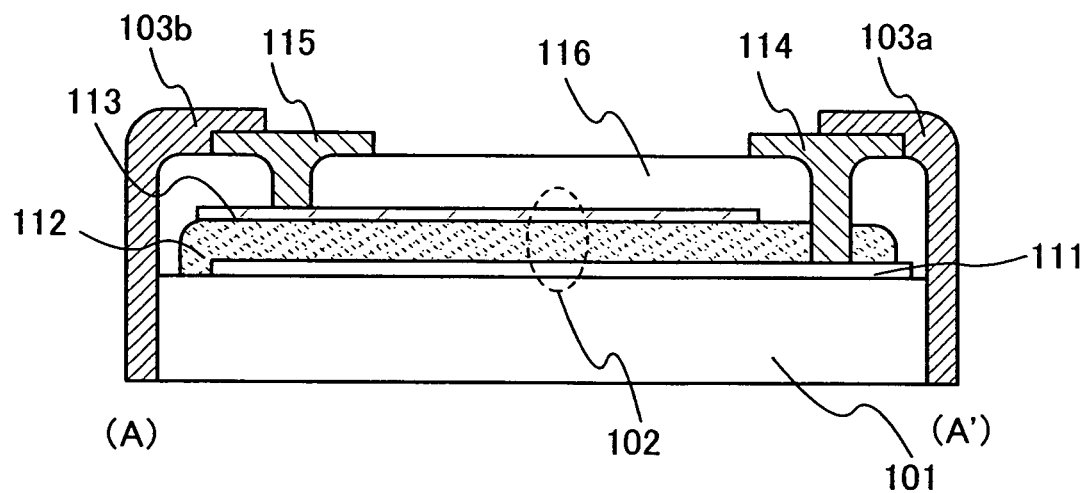

Next, FIG. 1B shows a cross-sectional view taken along the line (A)-(A') of FIG. 1A. The semiconductor element 102 is formed over the plastic substrate 101. The semiconductor element 102 includes a first electrode 111, a light-receiving portion 112, and a second electrode 113. A first electrode terminal 114 is connected to the first electrode 111 and a second electrode terminal 115 is connected to the second electrode 113. In addition, the first electrode terminal 114 is electrically insulated from the second electrode 115 with an interlayer insulating film 116 interposed therebetween. The first connection terminal 103a is connected to the first electrode terminal 114 and the second connection terminal 103b is connected to the second electrode terminal 115. Each of the first connection terminal 103a and the second connection terminal 103b is a terminal for connecting to an electrode terminal on a wiring board.

As the plastic substrate, a substrate that can resist heat in the step of mounting on the wiring board (typically, a substrate having glass-transition temperature of 260° C. or more) is preferable. Further, a substrate comprising an organic material dispersed with inorganic particles of several nm in diameter is also given as a representative example.

For a representative example of the mounting step on the wiring board, there are a reflow method using a conductive adhesive agent such as solder, a pressure-bonding method using an anisotropic conductive adhesive agent, and the like. When the pressure-bonding method is employed, a plastic substrate that is poor in heat resistance can be used, since it is mounted on a wiring board using an anisotropic conductive adhesive agent or an anisotropic conductive film.

A substrate having a certain degree thickness is preferably used for the plastic substrate, in order to increase the junction area. Representatively, a plastic substrate (plate) that is 100 to 1000 μm thick, preferably 20 to 500 μm thick, is preferable.

Polycarbonate (PC), ARTON made of norbornene resin including a polar group, which is manufactured by JSR corporation, polyethylene terephthalate (PET), polyether sulfone (PES), polyethylene naphthalate (PEN), nylon, polyetheretherketone (PEEK), polysulfone (PSF), polyetherimide (PEI), polyarylate (PAR), polybutylene telephthalate (PBT), polyimide, a HT substrate made of an organic material dispersed with inorganic particles of several nm in diameter, which is manufactured by Nippon Steel Corporation, and the like can be given as a representative example of the plastic substrate.

When light enters from the plastic substrate 101 side, the first electrode 111 is made of a light-transmitting conductive film that can have an ohmic contact with a semiconductor film made of silicon. An ITO (indium-tin oxide alloy), an indium zinc alloy ($In_2O_3$—ZnO), an zinc oxide (ZnO), indium-tin oxide including silicon oxide can be used, typically. The second electrode 113 is formed from a metal film that can have an ohmic contact with the semiconductor film made of silicon. It is formed from one element selected from aluminum (Al), titanium (Ti), chrome (Cr), nickel (Ni), molybdenum (Mo), palladium (Pd), tantalum (Ta), tungsten (W), platinum (Pt), gold (Au) or an alloy material containing 50% or more of the element, representatively. On the other hand, when light enters from the interlayer insulating film 116 side, the first electrode 111 is made of a metal film that can have an ohmic contact with a semiconductor film made of silicon, and the second electrode 113 is made of a light-transmitting conductive film that can have an ohmic contact with the semiconductor film made of silicon.

The light-receiving portion 112 can be formed from a semiconductor layer having silicon. A silicon layer, a silicon germanium layer, a silicon carbide layer and a PN junction layer or a PIN junction layer thereof are given for a representative example thereof. In this embodiment mode, the light-receiving portion 112 is formed from amorphous silicon with a PIN junction.

Each of the first electrode terminal 114 and the second electrode terminal 115 is a leading-out electrode, and a terminal for electrically connecting each of the first and second electrodes 111 and 113 to electrodes terminals formed on the wiring board. Accordingly, the first and second electrode terminals 114 and 115 are formed from a medium for connecting the first and second electrodes and wirings, for example, a conductive paste containing one or plural elements selected from silver, gold, copper, platinum, palladium, tin and zinc, or a material that can be connected to a solder paste or the like. Nickel (Ni), copper (Cu), zinc (Zn), palladium (Pd), silver (Ag), tin (Sn), platinum (Pt) or gold (Au), and preferably, one element chosen from nickel (Ni), copper (Cu), silver (Ag), platinum (Pt) and gold (Au), or an alloy material containing 50% or more of the element are given as a representative example. Note that the first and second electrode terminals 114 and 115 may have a single layer structure or a multilayer structure.

The first and second connection terminals 103a and 103b are formed in the concave portions in the side faces of the substrate and portions on a surface of the optical sensor. The connection terminals are each connected to respective electrode terminals. The connection terminals comprise a conductive paste containing one or plural elements selected from silver, gold, copper, platinum, palladium, tin and zinc or a material that can be bonded to a solder paste. Nickel (Ni), copper (Cu), zinc (Zn), palladium (Pd), silver (Ag), tin (Sn), platinum (Pt) or gold (Au), and preferably, one element selected from nickel (Ni), copper (Cu), silver (Ag), platinum (Pt) and gold (Au), or an alloy material containing 50% or more of the element are given as a representative example. Note that the metals are not necessarily a single composition (one element), but may be an alloy composition including it. Note that the alloy is an alloy including 50% or more of the metal as the main component. Note that the first electrode terminal 114 and the second electrode terminal 115 may have a single layer structure or a multilayer structure.

The interlayer insulating film 116 is formed to electrically insulate the electrode terminals 114 and 115 serving as the leading-out electrodes, as well as sealing respective electrodes 111 and 113, and the semiconductor element 102, and suppressing deterioration. The interlayer insulating film 116 can be formed from organic resin such as acryl, polyimide, polyamide, polyimidamide, or benzocyclobutene or an inorganic material such as a silicon oxide film, a silicon nitride oxide film or a silicon oxynitride film.

Figure 9A:
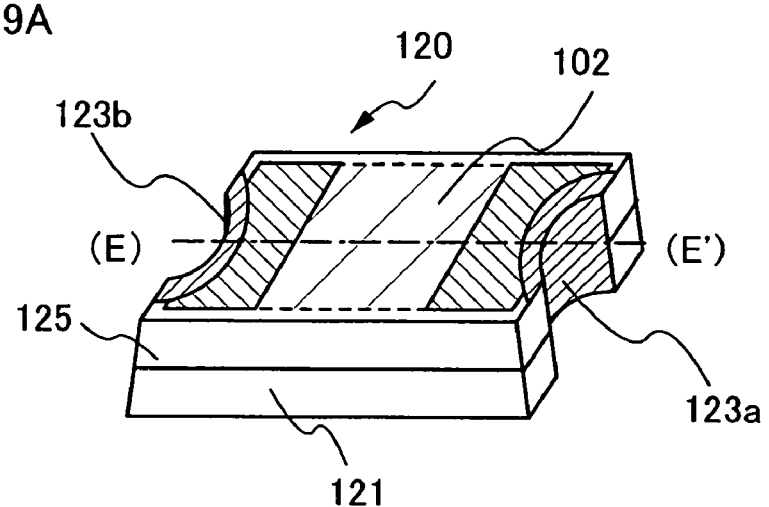
FIGS. 9A and 9B each show an oblique drawing and a cross sectional view of a semiconductor device of the present invention FIGS. 10A to 10C each show a cross sectional view of a semiconductor device of the present invention.
Figure 9B:
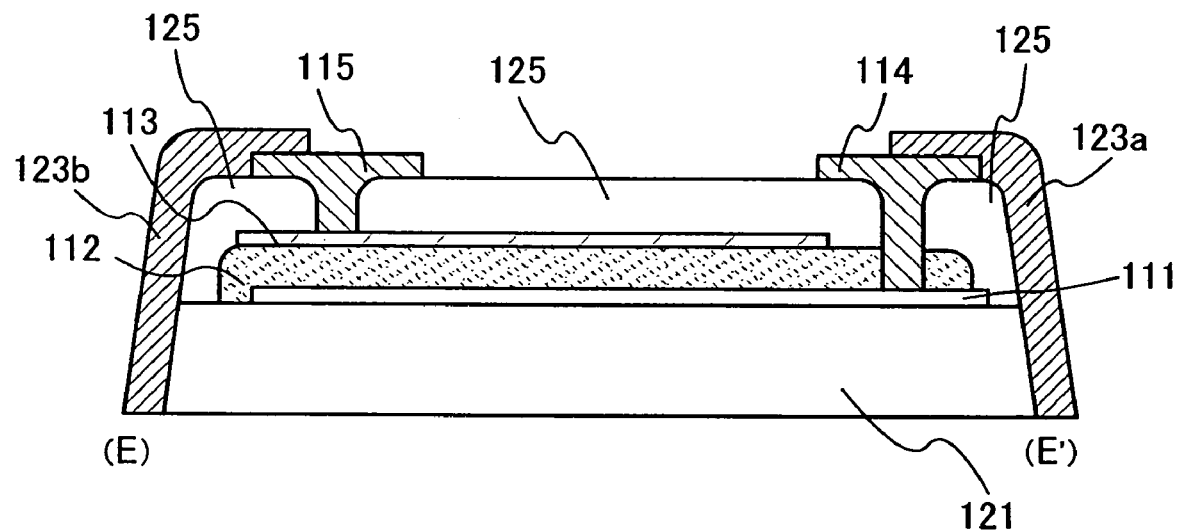

It is preferable that side faces of the optical sensor are sloping on which a conductive film to be connection terminals is formed. A structure at this time is shown in FIGS. 9A and 9B. FIG. 9A is an oblique drawing of an optical sensor 120. FIG. 9B shows a cross-sectional view taken along the line (E)-(E') of FIG. 9A. The side faces of an interlayer insulating film 125 and a substrate 121 have slopes, and connection terminals 123a and 123b are formed thereon, respectively. In the structure, when the conductive film is formed in a vapor phase of a vapor deposition method, a sputtering method or the like, the coverage of the conductive film can be enhanced and disconnection between films can be prevented. Note that the shape of the side faces of the substrate is not limited thereto, but may have a step like shape or a convex curved surface in the outside.

A structure of the semiconductor element of the optical sensor can employ other structures than the structure shown by the cross-sectional view in FIG. 1B. A cross-sectional view of an optical sensor having a different semiconductor element structure is shown in FIGS. 11A and 11B.

Figure 11A:
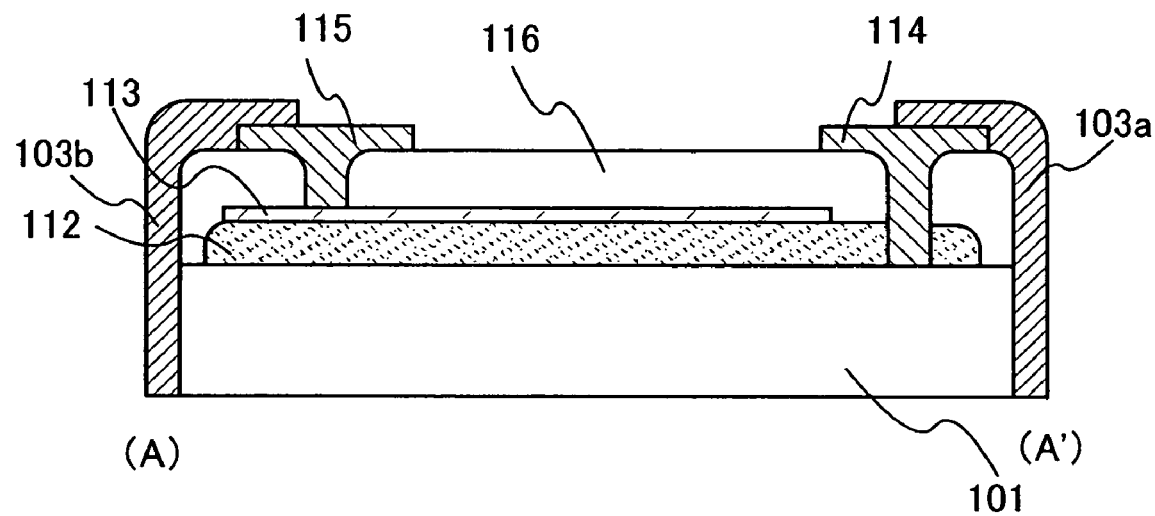
FIGS. 11A and 11B each show a cross sectional view of a semiconductor device of the present invention.

FIG. 11A is an example of a cross-sectional view of an optical sensor, which is formed from a light-receiving portion 112, a first electrode terminal 114 contacting with the light-receiving portion 112, a second electrode 113, a second electrode terminal 115 connected to the second electrode 113, and connection terminals 103a and 103b connected to the electrode terminals 114 and 115. A first electrode is not provided in FIG. 11A, which is different from the optical sensor in FIG. 1B. Accordingly, the number of connection portions (contact portion) is preferably large, since the reliability of the device is enhanced by increasing the area in which the first electrode terminal 114 is in contact with the light-receiving portion 112. In this structure, it is possible to reduce the number of processes and increase transmittance of light that is transmitted from the substrate 101, since the first electrode is not provided.

Figure 11B:
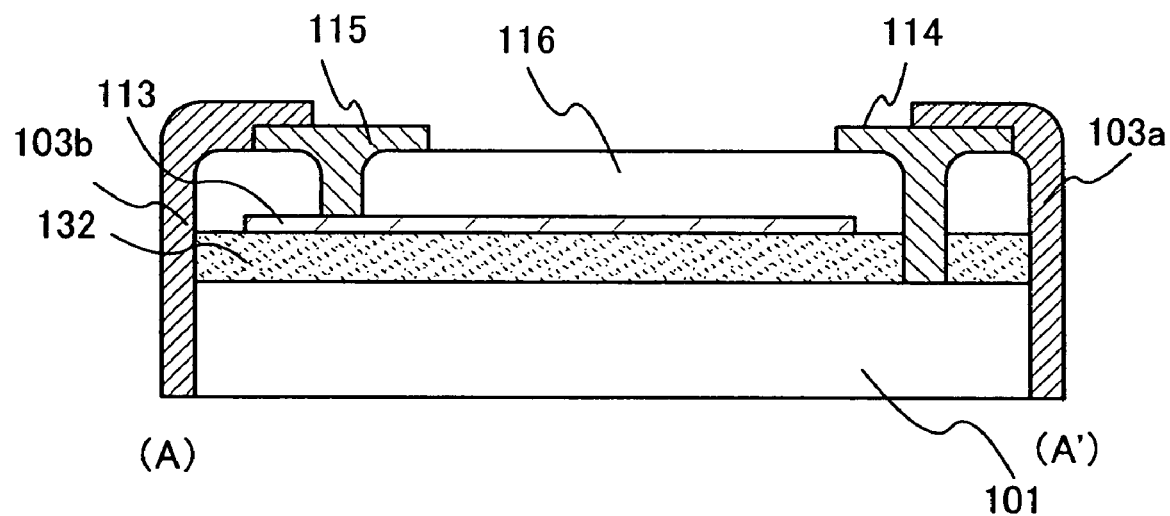

FIG. 11B is an example of a cross sectional view of an optical sensor, which is formed from a light-receiving portion 132, a first electrode terminal 114 contacting with the light-receiving portion 132, a second electrode 113, a second electrode terminal 115 connected to the second electrode, and connection terminals 103a and 103b connected to the electrode terminals 114 and 115. A layer of the light-receiving portion 132 is not patterned and is formed over the entire surface of the substrate 101, which is different from the optical sensor in FIG. 11A. Accordingly, a light-receiving portion can be formed without using a mask, and thus, an alignment control for the mask is not required. Therefore, yield can be improved.

According to the present invention, a semiconductor device can be formed over an insulating substrate. The semiconductor device of the present invention has a concave portion in a side face thereof, and a connection terminal can be formed in this area. A connection with an electrode terminal on a wiring board is made by a connection terminal and an electrode terminal. Thus, an area for connection with a wiring board can be increased, the mounting strength can be also increased, and at the same time, the condition of connection can be seen and confirmed visibly. Accordingly, reliability on process can be enhanced.

Embodiment Mode 2

An optical sensor having a circuit for amplifying current detected in a light-receiving portion is described with reference to FIGS. 2A and 2B. An example of using a thin film transistor (hereinafter, referred to as a TFT) as an element constituting an amplifier circuit is shown, but the present invention is not limited thereto and can employ an operational amplifier (op-amp) and the like.

Figure 2A:
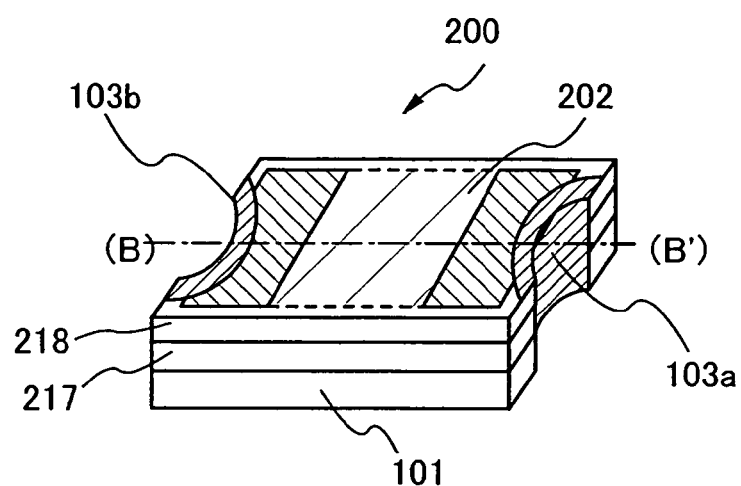
FIGS. 2A and 2B each show an oblique drawing and a cross sectional view of a semiconductor device of the present invention.

FIG. 2A is an oblique drawing of an optical sensor of this embodiment mode. As in Embodiment Mode 1, a semiconductor element 202 is formed on a surface of a plastic substrate 101. A diode or a TFT having such a structure shown in Embodiment Mode 1 can be appropriately applied to the semiconductor element. In addition, a side face of an optical sensor 200 has a concave portion, and a conductive film to be connection terminals 103a and 103b is formed therein. The shape shown in Embodiment Mode 1 can be applied to the shape of the concave portion in the side face of the optical sensor.

Figure 2B:
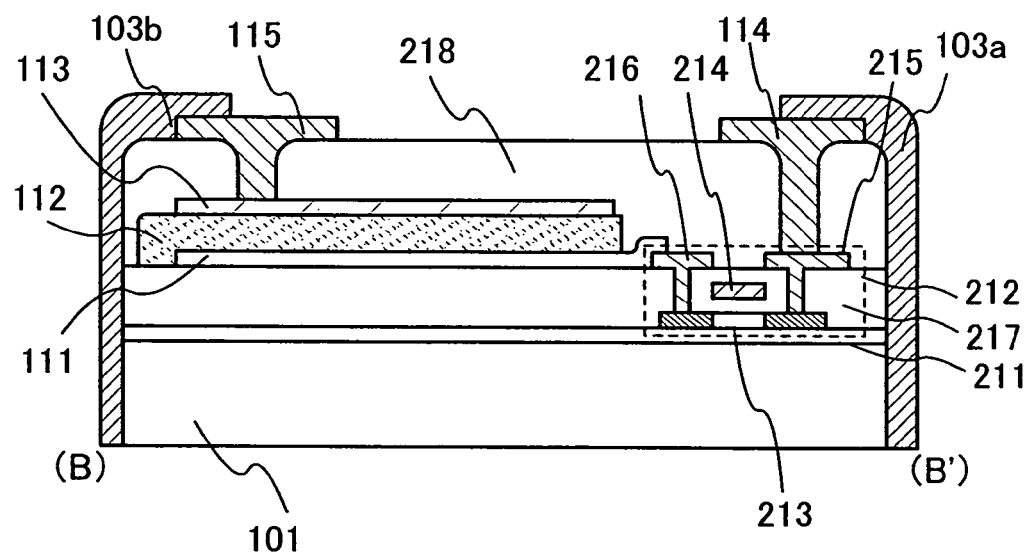

FIG. 2B is a cross-sectional view taken along the line (B)-(B') of FIG. 2A. A first insulating film 211 is formed over a plastic substrate 101 and a TFT 212 is formed thereon. The TFT 212 includes a semiconductor region 213 having a channel forming region, a source region and a drain region; a gate electrode 214; a source electrode 215 connected to the source region; and a drain electrode 216 connected to the drain region. In the TFT 212, the channel forming region, the gate electrode, the source electrode and the drain electrode are insulated from one another by a plurality of insulating films 217. In this embodiment mode, an n-channel TFT is used for the TFT 212. Only one TFT is shown in FIG. 2B, but plural TFTs can be formed.

The semiconductor region of the TFT 212 can be formed by using an amorphous semiconductor film, a crystalline semiconductor film or a microcrystal semiconductor film. The amorphous semiconductor film can be formed by plasma CVD, low pressure CVD or sputtering. The crystalline semiconductor film is formed by the above-mentioned method and then, it can be crystallized by a laser crystallization method, a crystallization method by heating, or a method disclosed in Japanese Patent Laid Open No. H8-78329. According to the technique of the gazette, a metal element for promoting crystallization is selectively added into an amorphous silicon film, and heat-treated to expand the element from the added region that is a starting point, thereby forming a semiconductor film having a crystal structure. Note that it is preferable to remove the metal element after crystallization in this treatment.

The microcrystal semiconductor film has an intermediate structure between an amorphous structure and a crystal structure (including a single crystal, and polycrystal), the third state that is stable in free energy, and includes a crystalline region having a short distance order and lattice distortion. A crystal grain of 0.5 to 20 nm is included at least in a certain region in a film.

The microcrystalline semiconductor film is formed by performing glow discharging decomposition (plasma CVD) on a silicide gas. As the silicide gas, $SiH_4$, $Si_2H_6$, $SiH_2Cl_2$, $SiHCl_3$, $SiCl_4$, $SiF_4$, and the like can be used. The silicide gas may be diluted with $H_2$, or $H_2$ and one or more of rare gas elements: He, Ar, Kr, and Ne. Dilution ratio is within the range of from twice to 1000 times. At this time, the pressure is roughly within the range of from 0.1 Pa to 133 Pa; power frequency is from 1 MHz to 120 MHz, preferably from 13 MHz to 60 MHz; and substrate heating temperature is at most 300° C., preferably from 100° C. to 250° C. An atmospheric constitution impurity such as oxygen, nitrogen, or carbon as an impurity element within a film is preferably at most $1\times10^{20}/cm^3$ or less, in particular, oxygen concentration is at most $5\times10^{19}/cm^3$ or less, preferably, at most $1\times10^{19}/cm^3$ or less.

A first electrode 111, a light-receiving portion 112, a second electrode 113, and an interlayer insulating film 218 are laminated sequentially over the insulating films 217. A structure and a material for them can be appropriately adapted from those described in Embodiment Mode 1.

Here, a connection of a first electrode and a drain electrode that are each formed on the insulating films 217, of a light-receiving portion, is described with reference to FIGS. 10A to 10C.

FIG. 10A shows a wiring (a drain electrode) 1301, a first electrode 1302 connected to the wiring 1301, a light-receiving portion 1303 formed on the first electrode 1302, and a second electrode 1304 formed on the light-receiving portion 1303. In this structure, a whole face of one side of the light-receiving portion 1303 is in contact with the first electrode 1302. Further, the adhesiveness of the insulating films 217 and the first electrode 1302 is increased, and thus, a film-peeling that occurs between the light-receiving portion 1303 and the insulating films 217 can be prevented in this structure.

FIG. 10B shows a wiring (drain electrode) 1311, a light-receiving portion 1313 covering a portion of the wiring 1311, and the second electrode 1314. In this structure, the wiring 1311 serves also as the first electrode 1302 in FIG. 10A. Further, in this structure, it is possible to reduce the number of processes and increase transmittance of light that is transmitted from the insulating films 217, since the first electrode is not provided.

FIG. 10C shows a wiring (a drain electrode) 1321, a first electrode 1322 connected to the wiring 1321, a light-receiving portion 1323 covering a portion of the first electrode 1322 and the insulating films 217, and a second electrode 1324. In this structure, the area of the first electrode is small, and a portion of the light-receiving portion is in contact with the insulating films 217. Accordingly, there is an effect that the transmittance of light transmitted from the interlayer insulating film 217 is increased.

Then, as shown in FIG. 2B, a first electrode terminal 114 is connected to a source electrode of a TFT 212, and a second electrode terminal 115 is connected to a second electrode 113 of a light-receiving portion 112. A first connection terminal 103a is connected to the first electrode terminal 114, and a second connection terminal 103b is connected to the second electrode terminal 115. The first connection terminal 103a and the second connection terminal 103b are terminals for connecting to wirings on a wiring board. As for these materials, materials shown in Embodiment Mode 1 can be employed, similarly.

In this embodiment mode, a top gate type TFT is shown as the TFT, but the TFT is not limited thereto and may be a bottom gate type TFT, an inversely staggered TFT or the like.

According to the present invention, a semiconductor device can be formed on an insulating substrate. A semiconductor device of this embodiment mode is an optical sensor having an amplifier circuit. Accordingly, feeble light can be also detected. Even when the area for receiving light of the optical sensor is small, high output can be obtained. A concave portion is formed on a side face of the optical sensor, and a connection terminal can be formed in this region. Thus, an area for connection with a wiring board can be increased, the mounting strength is also increased, and at the same time, the condition of connection can be seen and confirmed visibly. Accordingly, reliability on process can be enhanced.

Embodiment Mode 3

Figure 3:
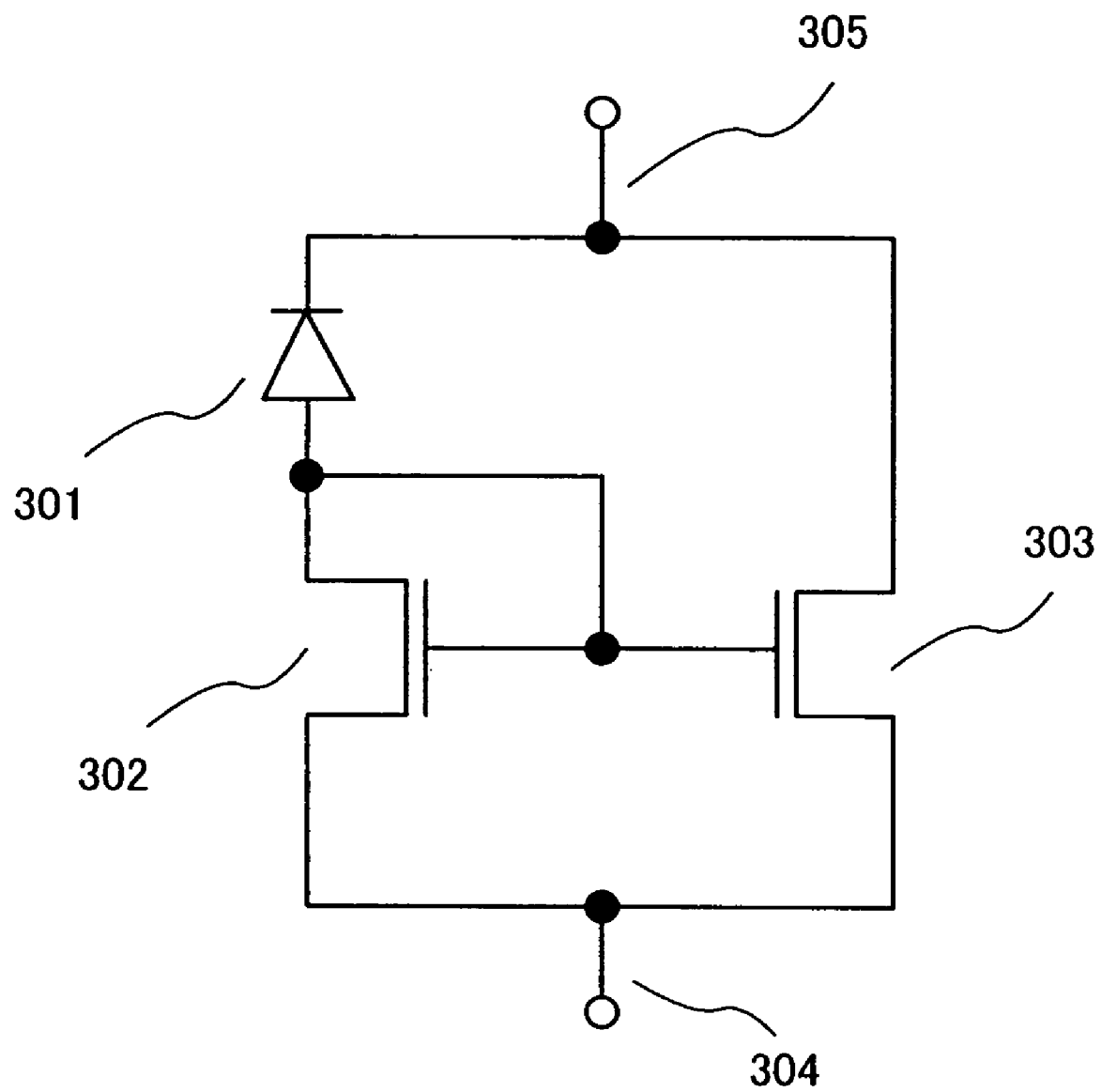
FIG. 3 shows a driver circuit of a semiconductor device of the present invention.

An example of a driver circuit of an optical sensor in Embodiment Mode 2 is shown with reference to FIG. 3. In this embodiment mode, a current mirror circuit is used as an amplifier circuit in the optical sensor.

Herein, two transistors are connected to each other and one of them is connected to a diode (a light-receiving portion). The TFT connected to a diode 301 is a first TFT 302, and the TFT that is connected to the first TFT in parallel is a second TFT 303. Gate electrodes and source wirings of the first TFT 302 and the second TFT 303 are connected to one another. A drain of the first TFT 302 is connected to a cathode of the diode 301, and an anode of the diode 301 is connected to a drain of the second TFT 303. Sources of the first TFT and the second TFT are connected to $V_{SS}$ 304. The anode of the diode and the drain of the second TFT are connected to $V_{DD}$ 305 that is an output terminal, and brightness of light can be detected by a value of current flowing at the point.

When light enters the diode 301, light current flows from the anode to the cathode in the diode 301. Thus, current $I_1$ flows between the source and the drain of the first TFT 302. Voltage $V_1$ is generated between the source and drain of the first TFT 302, since the drain of the first TFT 302 is connected to the gate electrode thereof. Voltage $V_2$ is generated between the source and the drain of the second TFT 303. The sources and the gates of the first TFT 302 and the second TFT 303 are connected to one another. When the first TFT 302 and the second TFT 303 are driven in a linear region, current at the voltage $V_1$ and the voltage $V_2$ can approximate current $I_1$. Accordingly, current $I_1$ flows between the source and the drain of the second TFT 303, too. The two TFTs 302 and 303 are connected to each other in parallel, and thus, current 211 flows in the output terminal 305.

The first TFT 302 converts current, which is generated when the diode 301 is irradiated with light, into voltage, and the second TFT 303 amplifies the current generated in the diode 301 through the first TFT 302. Note that the current generated in the diode can be more amplified by connecting plural TFTs for amplifying in parallel. In other words, when n TFTs for amplifying are connected in parallel with the first TFT 302, (1+n) times current as much as the current generated in the diode 301 flows in the output terminal 305.

In addition, it is also effective to increase a W/L ratio of the second TFT so as to amplify current generated in the diode which is a current source. Specifically, the current generated in the current source can be amplified and detected, since current flowing in the second TFT increases by increasing the channel width (W) of the second TFT or decreasing the channel length (L) thereof.

In this embodiment mode, the optical sensor using the current mirror circuit is shown, but the present invention is not limited thereto. For example, instead of the current mirror circuit, an operational amplifier or the like can be employed.

According to the present invention, a semiconductor device can be formed on an insulating substrate. Because the connection terminal has two terminals in the semiconductor device of this embodiment mode, the number of pins and the mounting area can be reduced. In addition, feeble light can be detected, since an amplifier circuit is provided. Even when the area of the light-receiving portion of the optical sensor is small, high output can be obtained. Further, a concave portion is in a side face of the optical sensor, and a connection terminal can be formed in this region. Thus, an area for connection with a wiring board can be increased, the mounting strength can be also increased, and at the same time, the condition of connection can be seen and confirmed visibly. Accordingly, reliability on process can be enhanced.

Embodiment Mode 4

In this embodiment mode, a step of manufacturing an optical sensor shown in Embodiment Modes 1 to 3 is described with reference to FIGS. 4A to 4D.

Figure 4A:
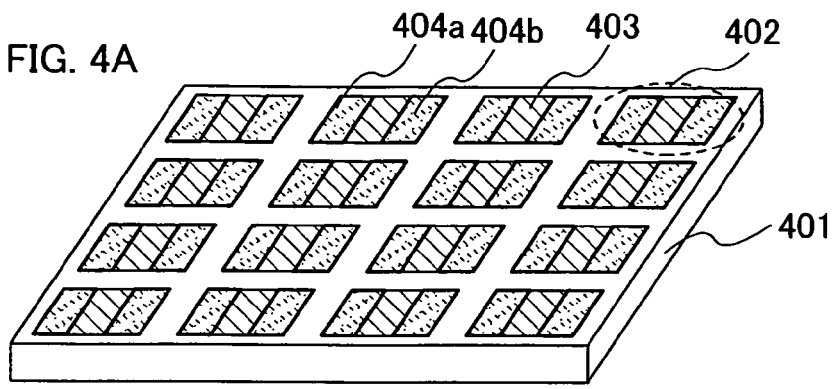
FIGS. 4A to 4D each show a manufacturing step of a semiconductor device of the present invention.

As shown in FIG. 4A, a semiconductor element 402 (light-receiving portion (not shown), an electrode 403 and electrode terminals 404a and 404b) is formed on a plastic substrate 401 by a known technique. Note that a semiconductor element can be formed on a substrate with a Roll to Roll type plasma CVD apparatus, in the case of using a flexible plastic substrate. Mass-production is possible by using the apparatus, and thus, cost reduction of an optical sensor can be achieved.

Figure 4B:
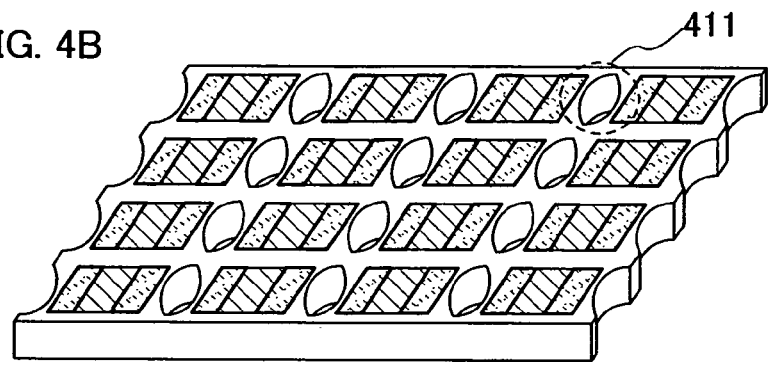

Then, as shown in FIG. 4B, an opening portion 411 is formed at a desired position of the plastic substrate by laser irradiation. The position of the opening portion is different depending on a structure of each sensor element, but may be formed in a region for providing a connection terminal. In this embodiment mode, a pair of opening portions is formed in both sides of the semiconductor element.

Figure 4C:
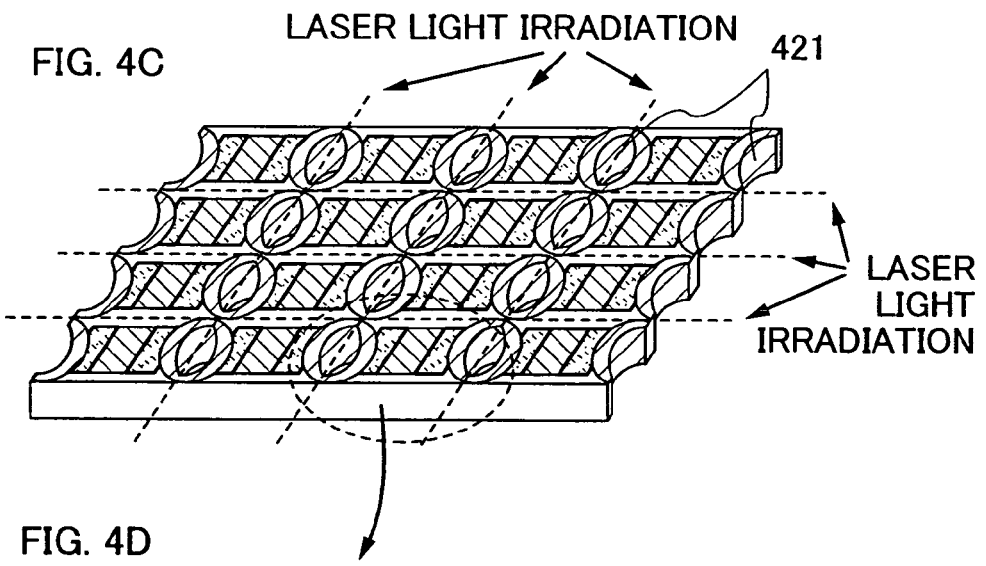
Figure 4D:
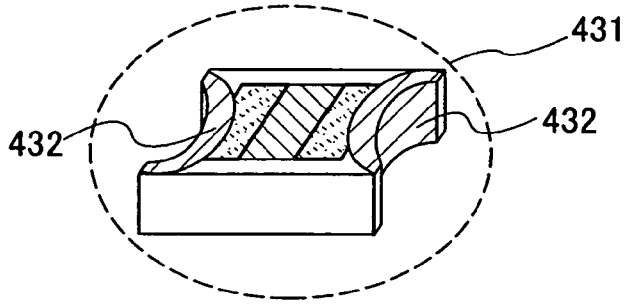

As shown in FIG. 4C, a conductive film 421 is formed in the opening portion 411. For the film formation method, a sputtering method, a vapor deposition method or a chemical vapor deposition using a mask, an electrolytic plating method or the like can be employed. Next, the plastic substrate is irradiated with laser light to form a groove in the plastic substrate, thereby obtaining an optical sensor 431 shown in FIG. 4D. A connection terminals 432 are formed in concave portions on side facea of the optical sensor 431.

A semiconductor device can be formed on an insulating substrate through the above described steps. Further, a concave portion is formed on a side face of the semiconductor element of the present invention, and a connection terminal can be formed over the concave portion. Thus, an area for connection with a wiring board can be increased, the mounting strength is also increased, and at the same time, the condition of connection can be seen and confirmed visibly. Accordingly, reliability on process can be enhanced. Moreover, it is possible to manufacture a semiconductor device that can provide a high yield and that can realize a high density mounting on a wiring board as well as cost reduction, since a semiconductor element is formed directly on a substrate and the step of mounting the semiconductor element on a substrate is omitted. In addition, by forming an opening portion in the substrate and then forming a conductive film along the opening portion, a connection terminal can be obtained. Thus, connection terminals of a plurality of semiconductor devices can be provided on one substrate. Therefore, it is possible to increase throughput in the step of forming a connection terminal, and to mass-produce.

Embodiment Mode 5

In this embodiment mode, a method for mounting an optical sensor formed in Embodiment Modes 1 to 4 on a wiring board is described with reference to FIGS. 5A and 5B.

Figure 5A:
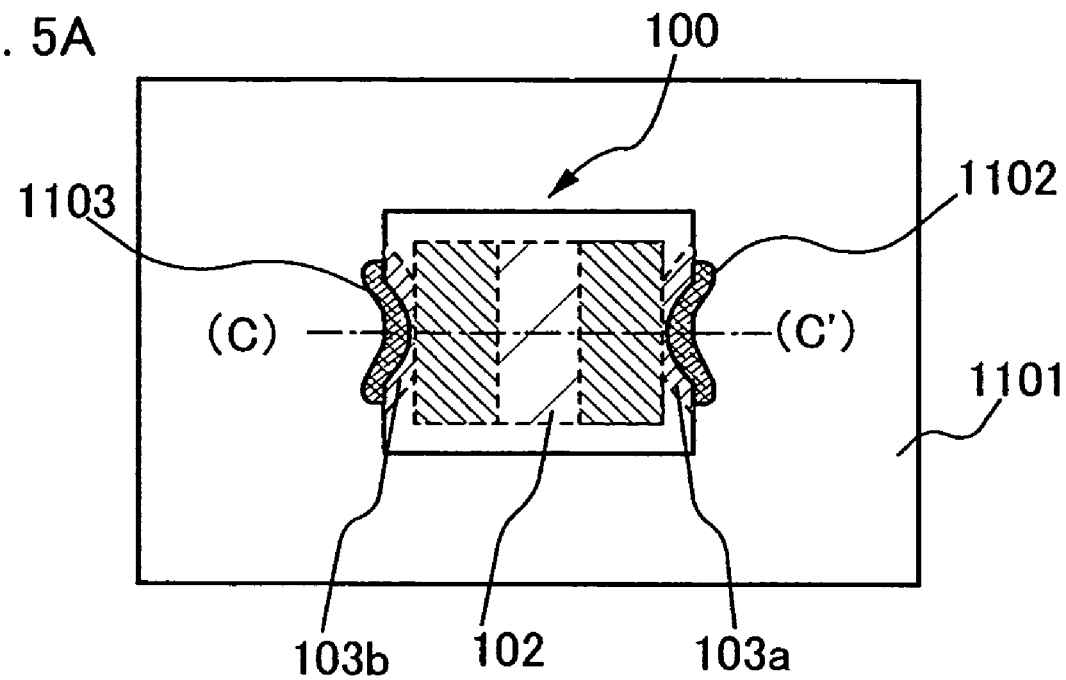
FIGS. 5A and 5B each show a top view and a cross sectional view in which a semiconductor device of the present invention is mounted on a wiring board.

FIG. 5A is a top view in which an optical sensor is mounted on a wiring board 1101. A semiconductor element 102 and connection terminals 103a and 103b are formed in the optical sensor 100. The optical sensor 100 is mounted on the wiring board 1101 by conductive pastes 1102 and 1103 or the like. In this embodiment mode, the semiconductor element 102 is mounted on the wiring board 1101 face to face.

Figure 5B:
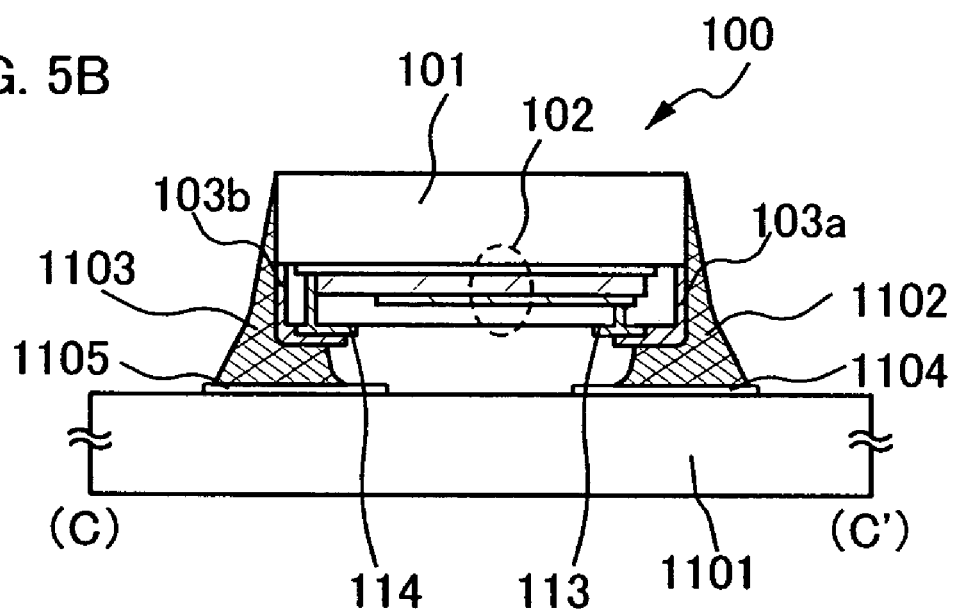

FIG. 5B is a cross-sectional structure taken along the line (C)-(C') of FIG. 5A.

The semiconductor element 102 is formed on a plastic substrate 101. The semiconductor element includes a first electrode, a light-receiving portion and a second electrode. Electrode terminals 113 and 114 that are connected to the first electrode and the second electrode, respectively, are each connected to the connection terminals 103a and 103b that are formed in side faces of the sensor. The connection terminals 103a and 103b are connected to electrode terminals 1104 and 1105 on the wiring board 1101 by the conductive pastes 1102 and 1103, respectively.

The pastes shown Embodiment Mode 1 can be used suitably for the conductive paste. In this embodiment mode, a conductive paste including silver is employed.

In this embodiment mode, the optical sensor 100 is mounted on the wiring board 1101 by a reflow step. Specifically, the conductive pastes 1102 and 1103 are applied to predetermined portions on the electrode terminals 1104 and 1105 by a screen printing method or a dispenser, and the optical sensor 100 is mounted thereon by a mounter. After that, the conductive pastes are melted by heating at temperatures from 250 to 350° C. to connect the electrode terminals 1104 and 1105 and the connection terminals 103a and 103b of the optical sensor 100 with the electrode terminals 1104 and 1105 on the wiring board 1101 electrically and mechanically.

An infrared heating method, a vapor phase soldering method, a hot-air heating method, a heating method using a hot plate, a heating method by laser irradiation and the like are given as the heating method.

Alternatively, the optical sensor may be mounted on the wiring board by locally pressure-bonding using an anisotropic conductive adhesive agent or an anisotropic conductive film, instead of using the method of mounting by the reflow step using a conductive paste.

Further, the optical sensor can be mounted in the state that the wiring board faces the plastic substrate, since the connection terminal is formed in a side face of the optical sensor, in this embodiment mode.

According to the present invention, a semiconductor device can be formed on a plastic substrate having heat resistance to a heat treatment in the step of mounting. The optical sensor of the present invention has a concave portion in a side face of a substrate, and a connection terminal can be formed in this region. The connection with an electrode terminal on a wiring board is made by a connection terminal and an electrode terminal. Thus, an area for connecting with a wiring board can be increased, the mounting strength can be also increased, and at the same time, the condition of connection can be seen and confirmed visibly. Accordingly, reliability on process can be enhanced.

Embodiment 1

Embodiments of the present invention are described with reference to FIGS. 6A to 6D, 7A to 7D, and 8A to 8D. FIGS. 6A, 6C, 7A, 7C, 8A and 8C are top views of substrates, and FIGS. 6B, 6D, 7B, 7D, 8B and 8D are cross sectional views taken along the line (D)-(D') in the figures.

Figure 6A:
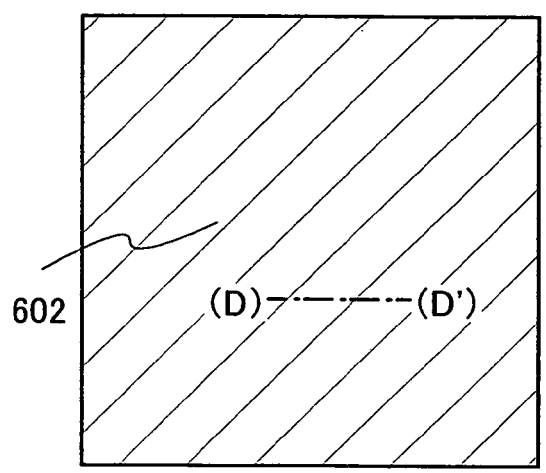
FIGS. 6A to 6D each show a step of manufacturing a semiconductor device of the present invention.
Figure 6B:
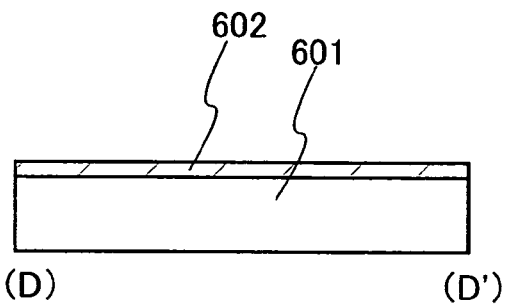

As shown in FIGS. 6A and 6B, a semiconductor film is formed on a plastic substrate 601 with a plasma CVD apparatus. Here, a silicon semiconductor film 602 having respective conductive type p, i, and n is formed as the semiconductor film. Herein, the i-layer which is a light-receiving portion has amorphous phase, and phase states of p and n are not considered. The film thickness of the i-layer is fit in an illumination range of an intended element to be set to 100 to 1000 nm. In this embodiment, an HT substrate manufactured by Nippon Steel Corporation is used as the plastic substrate, and a silicon semiconductor film is formed to have a thickness of 800 nm thereon. Note that the plastic substrate is 200 to 500 µm.

Figure 6C:
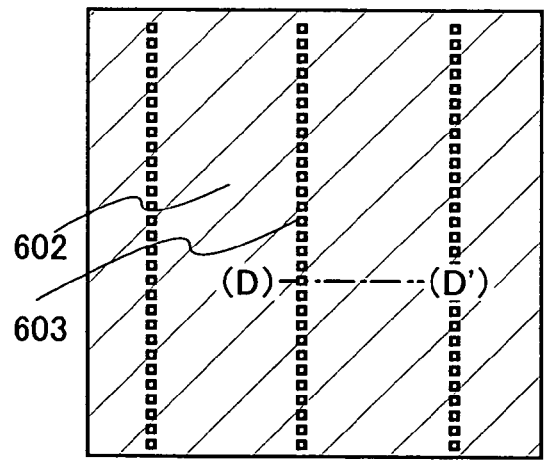
Figure 6D:
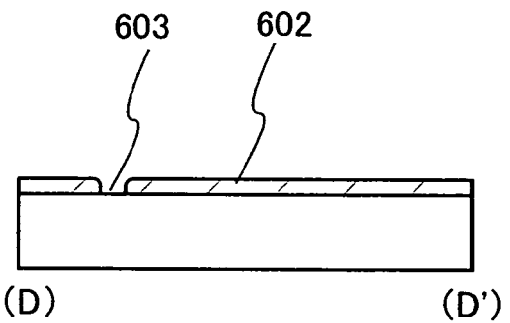

Then, a contact hole 603 is formed at a predetermined portion in a laser scribe step in order that a p-type silicon film that is a lower portion of the formed semiconductor film is to be connected with a metal electrode formed in the next step, as shown in FIGS. 6C and 6D. In this step, the scribing is preferably performed to leave a p-type semiconductor layer at the bottom of the contact hole, but it is difficult to control in the depth direction by a laser and thus, the contact hole may be formed into the surface of the plastic substrate, not to pass through it, for assuring a process margin. Accordingly, the actual contact portion between the metal electrode and the p-type semiconductor layer is a small region, since it is equivalent to an area of an exposed portion of the p-type semiconductor layer in the contact hole, in other word, a width of the area is equivalent to the thickness of the p-type semiconductor layer. Thus, a large number of independent holes are formed on the substrate in order to increase the area for contacting. Further, the energy densities of an edge and a center of a beam can be changed sequentially with a gentle slope by defocusing intentionally when it is assumed that focus control of a laser beam is possible by using a condensing optical system. At this time, laser scribing is performed to form a taper in a wall face of a scribed portion, thereby enlarging more contact areas. In this embodiment, a YAG laser having a wavelength of 1.06 µm and a beam diameter (φ) of 60 µm is used to scan a laser beam with an oscillation frequency of 1 kHz at a rate not to be overlapped.

Figure 7A:
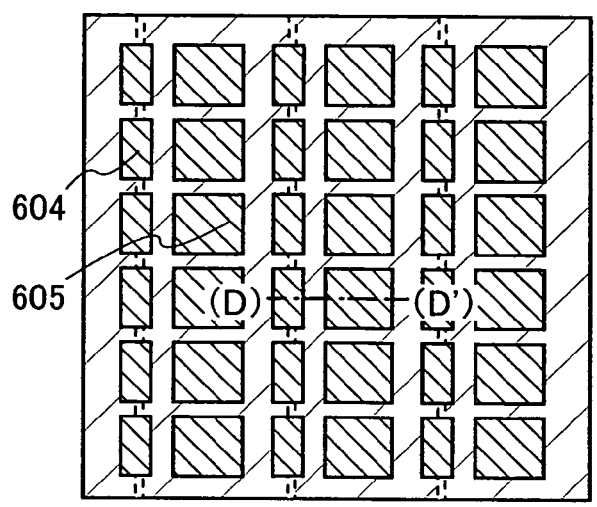
FIGS. 7A to 7D each show a step of manufacturing a semiconductor device of the present invention.
Figure 7B:
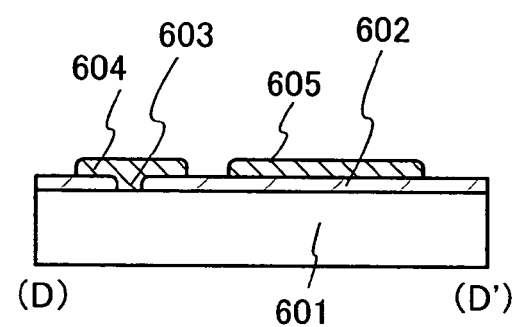

Then, as shown in FIGS. 7A and 7B, a first electrode 604 and a second electrode 605 are formed. A metal conductive film is formed to have a single layer structure or a laminated structure as the first electrode and the second electrode. As the film formation method, a sputtering method, a vapor deposition method or a plating method may be employed or the methods are employed together. A desired electrode shape can be obtained easily by using a metal mask, in the case of using a vapor phase method such as sputtering or vapor deposition. Two opening portions for one element are formed in the metal mask, and electrodes of the both poles are formed simultaneously. The metal mask, the plastic substrate and a magnet plate are overlapped in this order, and they are set in a sputtering apparatus in the state. By completely adhering the metal mask to the plastic substrate tightly, inhomogeneous of the electrode area due to intrusion of the deposited film therebetween is prevented. When a plating method is employed, masking is conducted on resin in advance by a screen-printing method in the region where a metal electrode is not required, and a desired electrode shape can be obtained by a lift-off method after forming the first electrode and the second electrode. The first and second electrodes 604 and 605 of 0.5 to 100 µm thick are formed under the foregoing conditions.

An Ni metal is formed by using a metal mask by a sputtering method in this embodiment. The metal mask is 0.1 mm thick and comprises nickel. The metal mask and the plastic substrate are set in the sputtering apparatus in the state that they are adhered tightly with the magnet plate. A film made of nickel is formed by sputtering using a Ni target of six inches in diameter with purity 99.99% and by discharging in an argon atmosphere of 1.0 Pa, with an RF output of 1.0 kW.

Figure 7C:
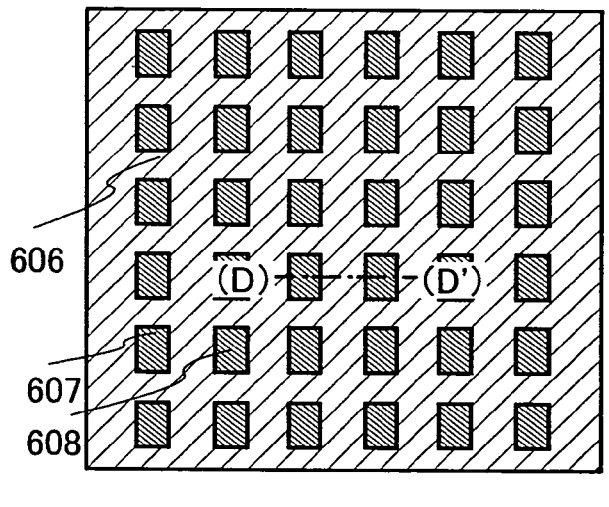
Figure 7D:
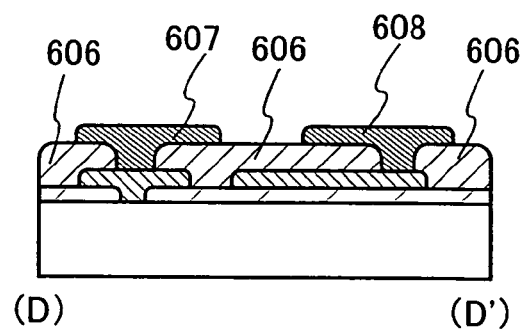

Then, as shown in FIGS. 7C and 7D, an insulating film 606 is formed, in which portions of the first electrode 604 and the second electrode 605 are each exposed via contact holes. A screen-printing method is employed for forming the insulating film. The insulating film 606 is 1.6 µm thick. Instead of the screen-printing method, an insulating film may be formed over the entire face of the substrate by a CVD method or an application method, and then, a portion thereof may be etched to form a contact hole for exposing each electrode. It is possible to prevent an optical sensor from tilting when it is mounted on a wiring board, by forming the contact hole symmetrically.

Electrode terminals 607 and 608 that are leading-out electrodes are formed in the contact holes formed by exposing portions of a metal electrode. The electrode terminals 607 and 608 can be formed from a conductive film having a metal element such as silver, gold, copper, platinum, or nickel. Each of the leading-out electrodes is formed so as to have an area of 1.35×1.8 mm$^2$ in this embodiment. A conductive film having a laminated structure of titanium/nickel/gold is formed to be overlapped with portions of the electrode terminals 607 and 608 by a sputtering method using a mask in this embodiment.

Figure 8A:
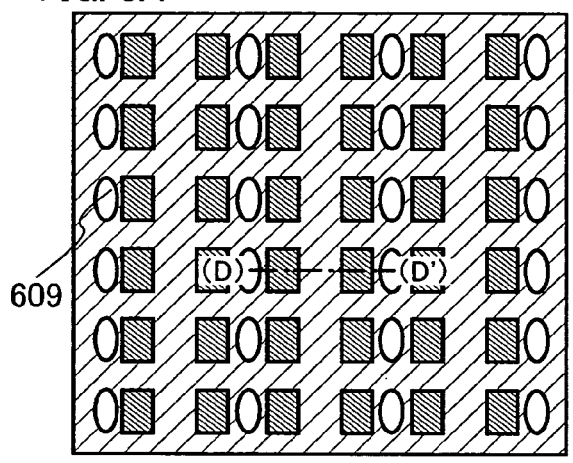
FIGS. 8A to 8D each show a step of manufacturing a semiconductor device of the present invention.
Figure 8B:
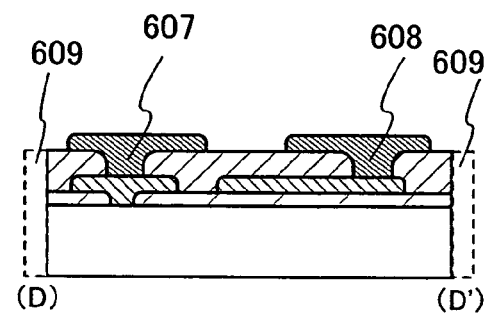

As shown in FIGS. 8A and 8B, opening portions 609 are formed. The opening portions are formed in the both sides of a region to serve as an optical sensor, namely, outside of the two metal electrodes, by laser irradiation. As for the method of forming the opening portion, the opening portions are formed to penetrate from the insulating film 606 to the surface of the plastic substrate 601 by laser irradiation or the like. Under the same condition as the laser irradiation condition employed in forming the contact hole 603, an opening portions 609 are formed on the both sides of a minor axis of a sensor element in this embodiment.

Figure 8C:
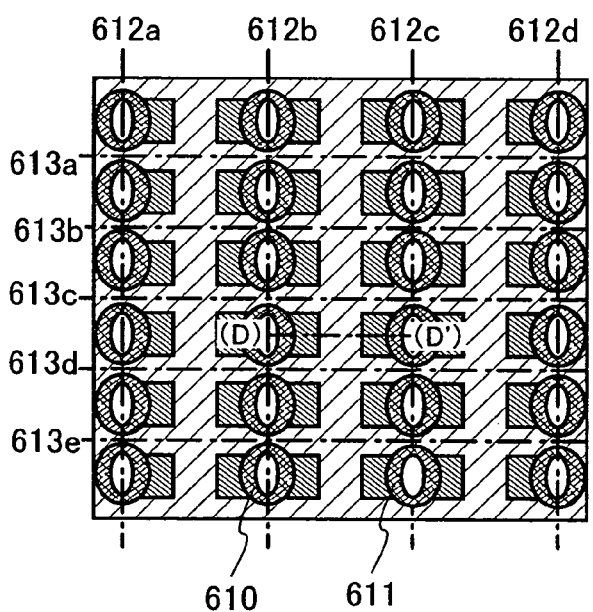
Figure 8D:
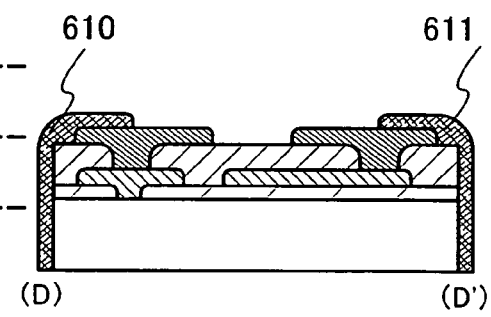

As shown in FIGS. 8C and 8D, conductive film that is to be connection terminals is formed on surfaces of the opening portions 609. The conductive film can be formed by the same method as the method for forming the first electrode 604 and the second electrode 605. In this embodiment, a nickel conductive film is formed by a sputtering method using a metal mask. The connection terminals 610 and 611 are formed to partially cover the electrode terminals.

An optical sensor is cut out in a laser scribing step. In this embodiment, a laser light is irradiated to regions where the opening portions are formed along axes A 612a to 612d and regions that is at right angle to the axis A and where the sensor element is not formed along axes B 613a to 613d in order to cut out the optical sensor.

The optical sensor can be formed through the foregoing steps.

According to this embodiment, the optical sensor can be formed on an insulating substrate. A concave portion is formed in a side face of the optical sensor, and a connection terminal can be formed in this region. Thus, an area for connection with a wiring board can be increased, the mounting strength is also increased, and at the same time, the condition of connection can be seen and confirmed visibly. Accordingly, reliability on process can be enhanced. Only an opening portion and a conductive film are formed to form a connection terminal, and thus, a connection terminal can be provided for every substrate. Therefore, it is possible to increase throughput in the step of forming a connection terminal, and to mass-produce.

Embodiment 2

Various electronic apparatuses can be manufactured by incorporating a semiconductor device obtained according to the present invention. Such electronic apparatuses include a portable telephone, a laptop personal computer, a digital camera, a gaming machine, a car navigation, a portable audio equipment, a handy AV equipment, a film camera, an instant camera, a room air-conditioner, a car air-conditioner, a ventilating and air conditioning equipment, an electric pot, a CRT type projection TV, a lighting equipment, lightning facilities and the like. Specific examples of the electronic devices are shown hereinafter.

An optical sensor of the present invention can be used in a portable telephone, a laptop personal computer, a digital camera, a gaming machine, a car navigation, a portable audio equipment and the like as a sensor for optimally adjusting brightness of a display and a backlight illuminance, and a sensor for saving a battery. A solar battery can be provided for these electronic devices as a battery. The semiconductor devices can be downsized and highly integrated, and thus, electronic devices can be more downsized by using them.

An optical sensor of the present invention can be mounted in an operation switch of a portable telephone, and a handy AV equipment as a sensor for controlling On and Off of a backlight LED and a cold cathode tube or a sensor for saving a battery. By being provided with a sensor, a switch is turned off in a bright environment, and battery consumption by a button operation can be reduced for a long time. Because semiconductor devices according to the present invention can be downsized and highly integrated, electronic apparatuses can be more downsized and power consumption can be saved.

Further, an optical sensor of the present invention can be mounted in a digital camera, a film camera, and an instant camera as a sensor of a flash light dimmer control or a sensor for an aperture control. In addition, a solar battery can be provided for these electronic devices as a battery. The semiconductor devices can be downsized and highly integrated, and thus, electronic devices can be more downsized by using them.

Moreover, an optical sensor of the present invention can be mounted in a room air-conditioner, a car air-conditioner, and a ventilating and air conditioning equipment as a sensor for controlling airflow or temperature. Because semiconductor devices according to the present invention can be downsized and highly integrated, electronic devices can be more downsized and power consumption can be saved.

An optical sensor of the present invention can be mounted in an electric pot as a sensor for controlling a temperature for keeping warm. After an indoor light is turned off, the temperature for keeping warm can be set low by the optical sensor of the present invention. Since the optical sensor is small and thin, it can be loaded at a desired position. Consequently, saving electric power can be achieved.

An optical sensor of the present invention can be mounted in a display of a CRT type projection TV as a sensor for adjusting a position of a scanning line (positioning of RGB scanning lines (Digital Auto Convergence)). Since the semiconductor device of the present invention can be downsized and highly integrated, the electronic device can be more downsized by using it and be provided with a sensor at a desired position. In addition, high-speed automatic control of the CRT type projection TV is possible.

An optical sensor of the present invention can be mounted in various domestic lightning equipment, an outdoor lamp, a street light, an unmanned public utility, an athletic field, a car, a calculator and the like as a sensor for controlling On and Off of various lightning equipment and lightning facilities. Electricity consumption can be saved by the sensor of the present invention. A battery can be downsized and thinned to downsize an electronic device by providing a solar battery according to the present invention for such electronic devices as a battery.

This application is based on Japanese Patent Application serial no. 2003-347676 filed in Japan Patent Office on Oct. 6, 2003, the contents of which are hereby incorporated by reference.

What is claimed is:

1. A semiconductor device comprising:
 a thin film transistor formed over an insulating substrate, comprising:
  a semiconductor film having at least a source region and a drain region;
  a gate insulating film; and
  a gate electrode, wherein the gate insulating film is interposed between the semiconductor film and the gate electrode,
 a semiconductor element electrically connected to one of the source region and the drain region; and
 a conductive film that is electrically connected to the semiconductor element,
 wherein the semiconductor device has a concave portion in a side face thereof, and
 wherein the conductive film is formed in the concave portion.

2. A device according to claim 1, wherein the conductive film is formed in a side face of the insulating film covering the semiconductor element and on a top face thereof.

3. A device according to claim 1, wherein an area of the insulating substrate and an area for forming the semiconductor element are approximately equal.

4. A device according to claim 1, wherein the concave portion has one of a curved surface and a flat surface.

5. A device according to claim 1, wherein the concave portion has a curved surface and a flat surface.

6. A device according to claim 1, wherein the semiconductor element has a semiconductor thin film.

7. A device according to claim 1, wherein the conductive film is formed from an element selected from nickel, copper, zinc, palladium, silver, tin, platinum and gold, and an alloy containing the element.

8. A device according to claim 1, wherein the insulating substrate is heat-resistant.

9. A device according to claim 1, wherein the insulating substrate is light-transmitting.

10. A device according to claim 1, wherein the insulating substrate is formed from one of plastic, glass and organic resin.

11. A device according to claim 1, wherein the semiconductor element has one of a thin film transistor and a diode.

12. A device according to claim 1, wherein the semiconductor element has a thin film transistor and a diode.

13. A device according to claim 1, wherein the semiconductor element is an integrated circuit having at least one of an optical sensor, a photoelectric conversion device, a solar battery, and a TFT.

14. A device according to claim 1, wherein the semiconductor device is incorporated into a camera.

15. A device according to claim 1, wherein the semiconductor device is incorporated into a personal computer.

16. A device according to claim 1, wherein the semiconductor device is incorporated into a portable information terminal.

17. A semiconductor device comprising:
a semiconductor element formed over an insulating substrate;
an electrode terminal connected to the semiconductor element; and
a connection terminal connected to the electrode terminal,
wherein the semiconductor device has a concave portion in a side face thereof, and
wherein the connection terminal is in contact with the insulating substrate and the semiconductor element in the concave portion.

18. A device according to claim 17, wherein the connection terminal is formed in a side face of the insulating film covering the semiconductor element and on a top face thereof.

19. A device according to claim 17, wherein an area of the insulating substrate and an area for forming the semiconductor element are approximately equal.

20. A device according to claim 17, wherein the concave portion has one of a curved surface and a flat surface.

21. A device according to claim 17, wherein the concave portion has a curved surface and a flat surface.

22. A device according to claim 17, wherein the semiconductor element has a semiconductor thin film.

23. A device according to claim 17, wherein at least one of the conductive film and the connection terminal is formed from an element selected from nickel, copper, zinc, palladium, silver, tin, platinum and gold, and an alloy containing the element.

24. A device according to claim 17, wherein the insulating substrate is heat-resistant.

25. A device according to claim 17, wherein the insulating substrate is light-transmitting.

26. A device according to claim 17, wherein the insulating substrate is formed from one of plastic, glass and organic resin.

27. A device according to claim 17, wherein the semiconductor element has one of a thin film transistor and a diode.

28. A device according to claim 17, wherein the semiconductor element has a thin film transistor and a diode.

29. A device according to claim 17, wherein the semiconductor element is an integrated circuit having at least one of a photoelectric conversion device, a solar battery, and a TFF.

30. A device according to claim 17, wherein the semiconductor device is incorporated into a camera.

31. A device according to claim 17, wherein the semiconductor device is incorporated into a personal computer.

32. A device according to claim 17, wherein the semiconductor device is incorporated into a portable information terminal.

33. A semiconductor device comprising:
a semiconductor element formed over an insulating substrate;
an insulating film covering the semiconductor element; and
a conductive film to be electrically connected to the semiconductor element,
wherein the semiconductor device has a concave portion in a side face thereof, and
wherein the conductive film is formed in the concave portion and covers side faces of the insulating substrate and the insulating film.

34. A device according to claim 33, wherein the conductive film is formed in a side face of the insulating film covering the semiconductor element and on a top face thereof.

35. A device according to claim 33, wherein an area of the insulating substrate and an area for forming the semiconductor element are approximately equal.

36. A device according to claim 33, wherein the concave portion has one of a curved surface and a flat surface.

37. A device according to claim 33, wherein the concave portion has a curved surface and a flat surface.

38. A device according to claim 33, wherein the semiconductor element has a semiconductor thin film.

39. A device according to claim 33, wherein the conductive film is formed from an element selected from nickel, copper, zinc, palladium, silver, tin, platinum and gold, and an alloy containing the element.

40. A device according to claim 33, wherein the insulating substrate is heat-resistant.

41. A device according to claim 33, wherein the insulating substrate is light-transmitting.

42. A device according to claim 33, wherein the insulating substrate is formed from one of plastic, glass and organic resin.

43. A device according to claim 33, wherein the semiconductor element has one of a thin film transistor and a diode.

44. A device according to claim 33, wherein the semiconductor element has a thin film transistor and a diode.

45. A device according to claim 33, wherein the semiconductor element is an integrated circuit having at least one of a photoelectric conversion device, a solar battery, and a TFT.

46. A device according to claim 33, wherein the semiconductor device is incorporated into a camera.

47. A device according to claim 33, wherein the semiconductor device is incorporated into a personal computer.

48. A device according to claim 33, wherein the semiconductor device is incorporated into a portable information terminal.

49. A semiconductor device comprising:
a semiconductor element formed over an insulating substrate;
an electrode terminal to be connected to the semiconductor element;
an insulating film covering the semiconductor element and the electrode terminal; and
a connection terminal to be connected to the electrode terminal through the insulating film,
wherein the semiconductor device has a concave portion in a side face thereof, and
wherein the connection terminal is in contact with side faces of the insulating substrate, the semiconductor element, and the insulating film in the concave portion.

50. A device according to claim 49, wherein the connection terminal is formed in a side face of the insulating film covering the semiconductor element and on a top face thereof.

51. A device according to claim 49, wherein an area of the insulating substrate and an area for forming the semiconductor element are approximately equal.

52. A device according to claim 49, wherein the concave portion has one of a curved surface and a flat surface.

53. A device according to claim 49, wherein the concave portion has a curved surface and a flat surface.

54. A device according to claim 49, wherein the semiconductor element has a semiconductor thin film.

55. A device according to claim 49, wherein at least one of the conductive film and the connection terminal is formed from an element selected from nickel, copper, zinc, palladium, silver, tin, platinum and gold, and an alloy containing the element.

56. A device according to claim 49, wherein the insulating substrate is heat-resistant.

57. A device according to claim 49, wherein the insulating substrate is light-transmitting.

58. A device according to claim 49, wherein the insulating substrate is formed from one of plastic, glass and organic resin.

59. A device according to claim 49, wherein the semiconductor element has one of a thin film transistor and a diode.

60. A device according to claim 49, wherein the semiconductor element has a thin film transistor and a diode.

61. A device according to claim 49, wherein the semiconductor element is an integrated circuit having at least one of a photoelectric conversion device, a solar battery, and a TFT.

62. A device according to claim 49, wherein the semiconductor device is incorporated into a camera.

63. A device according to claim 49, wherein the semiconductor device is incorporated into a personal computer.

64. A device according to claim 49, wherein the semiconductor device is incorporated into a portable information terminal.

65. A semiconductor device comprising:
a semiconductor element formed over an insulating substrate; and
a conductive film that is electrically connected to the semiconductor element,
wherein the semiconductor device has a concave portion in a side face thereof,
wherein the conductive film is formed in the concave portion, and
wherein a side surface of the insulating substrate has a tapered shape.

66. A device according to claim 65, wherein the conductive film is formed in a side face of an insulating film covering the semiconductor element and on a top face thereof.

67. A device according to claim 65, wherein an area of the insulating substrate and an area for forming the semiconductor element are approximately equal.

68. A device according to claim 65, wherein the concave portion has one of a curved surface and a flat surface.

69. A device according to claim 65, wherein the concave portion has a curved surface and a flat surface.

70. A device according to claim 65, wherein the semiconductor element has a semiconductor thin film.

71. A device according to claim 65, wherein the conductive film is formed from an element selected from nickel, copper, zinc, palladium, silver, tin, platinum and gold, and an alloy containing the element.

72. A device according to claim 65, wherein the insulating substrate is heat-resistant.

73. A device according to claim 65, wherein the insulating substrate is light-transmitting.

74. A device according to claim 65, wherein the insulating substrate is formed from one of plastic, glass and organic resin.

75. A device according to claim 65, wherein the semiconductor element has one of a thin film transistor and a diode.

76. A device according to claim 65, wherein the semiconductor element has a thin film transistor and a diode.

77. A device according to claim 65, wherein the semiconductor element is an integrated circuit having at least one of a photoelectric conversion device, a solar battery, and a TFT.

78. A device according to claim 65, wherein the semiconductor device is incorporated into a camera.

79. A device according to claim 65, wherein the semiconductor device is incorporated into a personal computer.

80. A device according to claim 65, wherein the semiconductor device is incorporated into a portable information terminal.

81. A device according to claim 1, wherein the semiconductor element is an optical sensor.

82. A device according to claim 17, wherein the semiconductor element is an optical sensor.

83. A device according to claim 33, wherein the semiconductor element is an optical sensor.

84. A device according to claim 49, wherein the semiconductor element is an optical sensor.

85. A device according to claim 65, wherein the semiconductor element is an optical sensor.

86. A semiconductor device comprising:
a thin film transistor formed over an insulating substrate, comprising:
a semiconductor film having at least a source region and a drain region;
a gate insulating film; and
a gate electrode, wherein the gate insulating film is interposed between the semiconductor film and the gate electrode,
a semiconductor element comprising a first electrode, a light-receiving portion and a second electrode; and
a conductive film that is electrically connected to the semiconductor element,
wherein the semiconductor device has a concave portion in a side face thereof, wherein the conductive film is formed in the concave portion, and wherein the first electrode is electrically connected to one of the source region and the drain region.

87. A device according to claim 86, wherein the conductive film is formed in a side face of an insulating film covering the semiconductor element and on a top face thereof.

88. A device according to claim 86, wherein an area of the insulating substrate and an area for forming the semiconductor element are approximately equal.

89. A device according to claim 86, wherein the concave portion has one of a curved surface and a flat surface.

90. A device according to claim 86, wherein the concave portion has a curved surface and a flat surface.

91. A device according to claim 86, wherein the semiconductor element has a semiconductor thin film.

92. A device according to claim 86, wherein the conductive film is formed from an element selected from nickel, copper, zinc, palladium, silver, tin, platinum and gold, and an alloy containing the element.

93. A device according to claim 86, wherein the insulating substrate is heat-resistant.

94. A device according to claim 86, wherein the insulating substrate is light-transmitting.

95. A device according to claim 86, wherein the insulating substrate is formed from one of plastic, glass and organic resin.

96. A device according to claim 86, wherein the semiconductor element has one of a thin film transistor and a diode.

97. A device according to claim 86, wherein the semiconductor element has a thin film transistor and a diode.

98. A device according to claim 86, wherein the semiconductor element is an optical sensor.

99. A device according to claim 86, wherein the semiconductor element is an integrated circuit having at least one of a photoelectric conversion device, a solar battery, and a TFT.

100. A device according to claim 86, wherein the semiconductor device is incorporated into a camera.

101. A device according to claim 86, wherein the semiconductor device is incorporated into a personal computer.

102. A device according to claim 86, wherein the semiconductor device is incorporated into a portable information terminal.

103. A semiconductor device comprising:
a thin film transistor formed over an insulating substrate, comprising:
   a semiconductor film having at least a source region and a drain region;
   a gate insulating film; and
   a gate electrode, wherein the gate insulating film is interposed between the semiconductor film and the gate electrode,
a semiconductor element comprising a first electrode, a light-receiving portion and a second electrode; and
a conductive film that is electrically connected to the semiconductor element, wherein the semiconductor device has a concave portion in a side face thereof, wherein the conductive film is formed in the concave portion, wherein the first electrode is electrically connected to one of the source region and the drain region, and wherein the first electrode comprises a light-transmitting conductive film.

104. A device according to claim 103, wherein the conductive film is formed in a side face of an insulating film covering the semiconductor element and on a top face thereof.

105. A device according to claim 103, wherein an area of the insulating substrate and an area for forming the semiconductor element are approximately equal.

106. A device according to claim 103, wherein the concave portion has one of a curved surface and a flat surface.

107. A device according to claim 103, wherein the concave portion has a curved surface and a flat surface.

108. A device according to claim 103, wherein the semiconductor element has a semiconductor thin film.

109. A device according to claim 103, wherein the conductive film is formed from an element selected from nickel, copper, zinc, palladium, silver, tin, platinum and gold, and an alloy containing the element.

110. A device according to claim 103, wherein the insulating substrate is heat-resistant.

111. A device according to claim 103, wherein the insulating substrate is light-transmitting.

112. A device according to claim 103, wherein the insulating substrate is formed from one of plastic, glass and organic resin.

113. A device according to claim 103, wherein the semiconductor element has one of a thin film transistor and a diode.

114. A device according to claim 103, wherein the semiconductor element has a thin film transistor and a diode.

115. A device according to claim 103, wherein the semiconductor element is an optical sensor.

116. A device according to claim 103, wherein the semiconductor element is an integrated circuit having at least one of a photoelectric conversion device, a solar battery, and a TFT.

117. A device according to claim 103, wherein the semiconductor device is incorporated into a camera.

118. A device according to claim 103, wherein the semiconductor device is incorporated into a personal computer.

119. A device according to claim 103, wherein the semiconductor device is incorporated into a portable information terminal.

* * * * *